(12) United States Patent
Visser et al.

(10) Patent No.: US 7,948,606 B2
(45) Date of Patent: May 24, 2011

(54) MOVING BEAM WITH RESPECT TO DIFFRACTIVE OPTICS IN ORDER TO REDUCE INTERFERENCE PATTERNS

(75) Inventors: Huibert Visser, Zevenhuizen (NL); Johannes Jacobus Matheus Baselmans, Oirschot (NL); Pieter Willem Herman De Jager, Rotterdam (NL); Henri Johannes Petrus Vink, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 1441 days.

(21) Appl. No.: 11/403,194

(22) Filed: Apr. 13, 2006

(65) Prior Publication Data

US 2007/0242253 A1 Oct. 18, 2007

(51) Int. Cl.
*G03B 27/42* (2006.01)
(52) U.S. Cl. ...................... 355/53; 359/209.1
(58) Field of Classification Search .................. 355/30, 355/53; 359/209.1, 210.1, 210.2, 211.1, 359/211.2, 211.3, 211.4, 211.5, 211.6, 212.1, 359/212.2, 213.1, 214.1, 215.1, 216.1, 218.1, 359/219.1, 219.2, 217.1, 217.2, 217.3, 217.4, 359/220.1
See application file for complete search history.

(56) References Cited

U.S. PATENT DOCUMENTS

| | | | |
|---|---|---|---|
| 3,520,586 A * | 7/1970 | Bousky | 359/212.2 |
| 4,308,544 A * | 12/1981 | Lucero et al. | 347/249 |
| 4,511,220 A | 4/1985 | Scully | |
| 4,619,508 A | 10/1986 | Shibuya et al. | |
| 4,744,615 A | 5/1988 | Fan et al. | |
| 4,974,919 A | 12/1990 | Muraki et al. | |
| 5,005,969 A | 4/1991 | Kataoka | |
| 5,153,773 A | 10/1992 | Muraki et al. | |
| 5,229,872 A | 7/1993 | Mumola | |
| 5,296,891 A | 3/1994 | Vogt et al. | |
| 5,363,170 A | 11/1994 | Muraki | |
| 5,500,736 A | 3/1996 | Koitabashi et al. | |
| 5,523,193 A | 6/1996 | Nelson | |
| 5,530,482 A | 6/1996 | Gove et al. | |
| 5,534,970 A | 7/1996 | Nakashima et al. | |
| 5,579,147 A | 11/1996 | Mori et al. | |
| 5,636,006 A | 6/1997 | Wu | |
| 5,650,871 A * | 7/1997 | Wilson | 359/216.1 |
| 5,677,703 A | 10/1997 | Bhuva et al. | |
| 5,808,797 A | 9/1998 | Bloom et al. | |
| 5,982,553 A | 11/1999 | Bloom et al. | |
| 6,008,943 A | 12/1999 | Metelitsa | |
| 6,133,986 A | 10/2000 | Johnson | |
| 6,169,634 B1 | 1/2001 | Sirat | |
| 6,177,980 B1 | 1/2001 | Johnson | |

(Continued)

FOREIGN PATENT DOCUMENTS

EP 1 521 110 A1 4/2005

(Continued)

*Primary Examiner* — Edward J Glick
*Assistant Examiner* — Mesfin T Asfaw
(74) *Attorney, Agent, or Firm* — Sterne, Kessler, Goldstein & Fox P.L.L.C.

(57) ABSTRACT

A system and method are used to form incoherent beams from at least a partially coherent beam, such that interference or speckle patterns are substantially eliminated. A rotating optical element directs the partially coherent beam to reflect from an angular distribution changing element to form an incoherent beam. The partially coherent beam can be directed at varying angles or positions onto the angular distribution changing element through rotation of the rotating optical element. The angles can vary as a function of time.

30 Claims, 15 Drawing Sheets

U.S. PATENT DOCUMENTS

| | | |
|---|---|---|
| 6,238,063 B1 * | 5/2001 | Tanitsu et al. .................. 362/268 |
| 6,310,679 B1 | 10/2001 | Shiraishi |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,906,805 B1 | 6/2005 | Ina et al. |
| 2002/0015156 A1 | 2/2002 | Ina et al. |
| 2002/0126479 A1 | 9/2002 | Zhai et al. |
| 2003/0147082 A1 | 8/2003 | Goldstein |
| 2003/0197846 A1 | 10/2003 | Coston et al. |
| 2004/0008392 A1 * | 1/2004 | Kappel et al. .................. 359/15 |
| 2004/0041104 A1 | 3/2004 | Liebregts et al. |
| 2004/0130561 A1 | 7/2004 | Jain |
| 2004/0156016 A1 * | 8/2004 | Kerr et al. ..................... 351/206 |
| 2004/0165165 A1 * | 8/2004 | Yun et al. ....................... 355/53 |
| 2004/0233406 A1 * | 11/2004 | Lan et al. ....................... 355/53 |
| 2005/0007572 A1 | 1/2005 | George et al. |
| 2005/0036197 A1 | 2/2005 | Awamura |
| 2005/0146702 A1 * | 7/2005 | Eurlings et al. ................. 355/67 |
| 2005/0168851 A1 * | 8/2005 | Sandstrom .................... 359/855 |
| 2005/0200929 A1 * | 9/2005 | Plotkin et al. .................. 359/212 |
| 2005/0207160 A1 | 9/2005 | Babayoff et al. |
| 2005/0226556 A1 | 10/2005 | Kanoshita et al. |
| 2007/0019178 A1 * | 1/2007 | Byers ............................. 355/69 |
| 2007/0206381 A1 * | 9/2007 | Fiolka et al. .................. 362/268 |

FOREIGN PATENT DOCUMENTS

| | | |
|---|---|---|
| EP | 1 521 111 A1 | 4/2005 |
| JP | 59 226317 A2 | 12/1984 |
| JP | 63-100461 A | 5/1988 |
| JP | 1 114035 A2 | 5/1989 |
| JP | 1 295215 A2 | 11/1989 |
| JP | 2-184853 A | 7/1990 |
| JP | 6 244082 A2 | 9/1994 |
| JP | 10 012542 A2 | 1/1998 |
| JP | 11 204432 A2 | 7/1999 |
| JP | 2000/244050 A2 | 9/2000 |
| JP | 2001/021448 A2 | 1/2001 |
| JP | 2002/022410 A2 | 1/2002 |
| JP | 2003/133210 A2 | 5/2003 |
| WO | WO 98/33096 | 7/1998 |
| WO | WO 98/38597 | 9/1998 |

* cited by examiner

MOVING BEAM WITH RESPECT TO DIFFRACTIVE OPTICS IN ORDER TO REDUCE INTERFERENCE PATTERNS

BACKGROUND

1. Field of the Invention

The present invention relates to radiation systems.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Typically, lithography systems use lasers as radiation sources to produce an illumination beam, e.g., a coherent illumination beam or a partially coherent illumination beam. During its travel through the lithography system, the coherent illumination beam may reflect from components in the lithography system, which can form scattered light. The scattered light can interfere with the coherent illuminating beam causing, e.g., speckle patterns in an image. Interference is patterns are typically observed in the far field (e.g., pupil plane). The speckle patterns are undesirable because they can cause errors in a pattern formed on a substrate. The speckle patterns can be caused by mutual interference of partially coherent beams that are subject to minute temporal and spatial fluctuations. The speckle patterns are sometimes referred to as noise-like characteristics of the coherent illumination beam. Speckle patterns can also be caused when an element that increases angular distribution is used because multiple copies of the coherent beam are made. The multiple copies of the coherent beam can interfere with each other when an optical path difference between the coherent beams (e.g., between generation of the beams and detection of the beams) is small compared to a coherence length (e.g., transverse and temporal) of the coherent beams.

Conventionally, the interference or speckle patterns have been compensated for through use of a diffractive or refractive optical element positioned after the laser, which are used to form an incoherent beam from the coherent beam. These elements are sometimes referred to as "coherence busting elements." As discussed above, the incoherent beam comprises multiple copies of the coherent beam.

Incoherence of the coherent beam can be further enhanced through movement of the optical element with respect to the coherent illumination beam. The movement of the optical element changes a phase distribution for each copy of the coherent beam, which changes the diffraction pattern for each copy of the coherent beam. Through integrating (e.g., summing) of all the diffraction patterns, uniform light is produced. However, a significant movement of the optical element is needed to substantially eliminate the interference or speckle patterns. Also, typically the significant movement must be done within a short period of time, for example an exposure time. In an example where 30 pulses are used from a 1000 Hz laser, the exposure time could be about 30 µs. The significant movement in this short period of time can cause large oscillations within the lithography system, including high acceleration and jerks. The high acceleration and jerks can cause problems within the lithography system. Also, due to typically limited integration time, e.g., about 50 ns per pulse, it becomes nearly impossible to move the optical element enough with respect to the beam to substantially eliminate the interference or speckle patterns.

Another way of compensating for the interference or speckle patterns is to use a large number of laser pulses, e.g., 60 laser pulses, during each exposure cycle. A different speckle pattern may result from each laser pulse. Thus, through use of a large number of laser pulses, the speckle patterns can be averaged out over time. However, recent lithography systems have decreased the number of laser pulses and/or have reduced the duration of each laser pulse during each exposure cycle. Unfortunately, reducing the number of laser pulses during each exposure cycle may not allow for the averaging effect to occur. Further, it may be difficult to move an optical element an acceptable amount during a reduced laser pulse duration to allow for compensation of the speckle patterns.

Therefore, what is needed is a system and method that substantially eliminates interference or speckle patterns when fewer laser pulses and/or laser pulses of reduced duration are used during each exposure cycle, without affecting the lithography system.

In one embodiment of the present invention, there is provided a system comprising a source of radiation, an angular distribution changing element, and a rotating optical element. The source of radiation produces at least a partially coherent beam. The rotating optical element is configured to (a) receive the partially coherent beam from the source of radiation and (b) direct the received partially coherent beam to reflect from the angular distribution changing element to form an incoherent beam. The partially coherent beam is directed by the rotating optical element at varying angles or positions onto the angular distribution changing element based on a rotation speed of the rotating optical element, the angles varying as a function of time.

Additionally, or alternatively, the system can be a laser. Additionally, or alternatively, the system can be an illuminator.

Additionally, or alternatively, the system can be located within a lithography system, which includes a patterning device and a projection system. In this example, an illumination beam is formed from the incoherent beam. The illumination beam is directed to be patterned by the patterning device, and the projection system projects the patterned beam onto a substrate.

In another embodiment, there is provided a device manufacturing method. At least a partially coherent beam is directed by a rotating optical element to reflect from an angular distribution changing element to form an incoherent beam. An illumination beam is formed from the incoherent beam. The illumination beam is patterned. The patterned beam is projected onto a target portion of a substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 7:
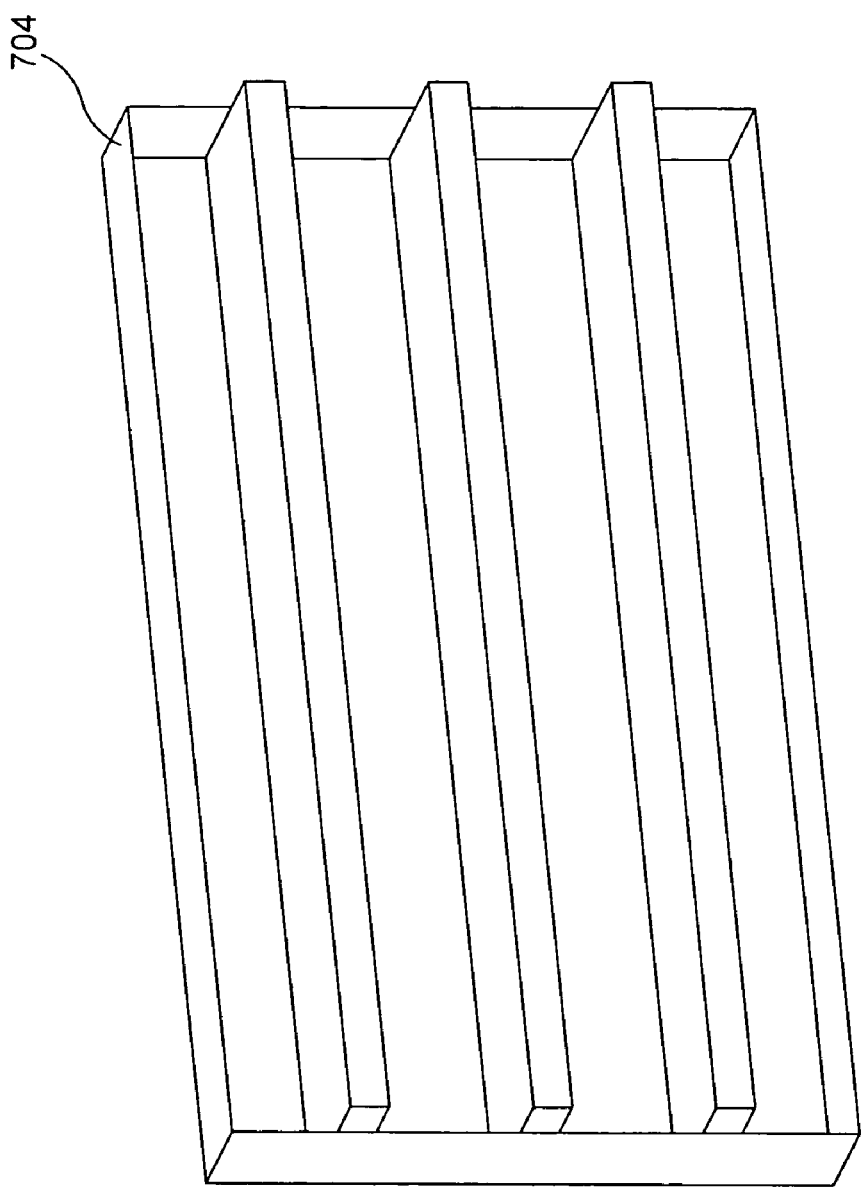
Figure 8:
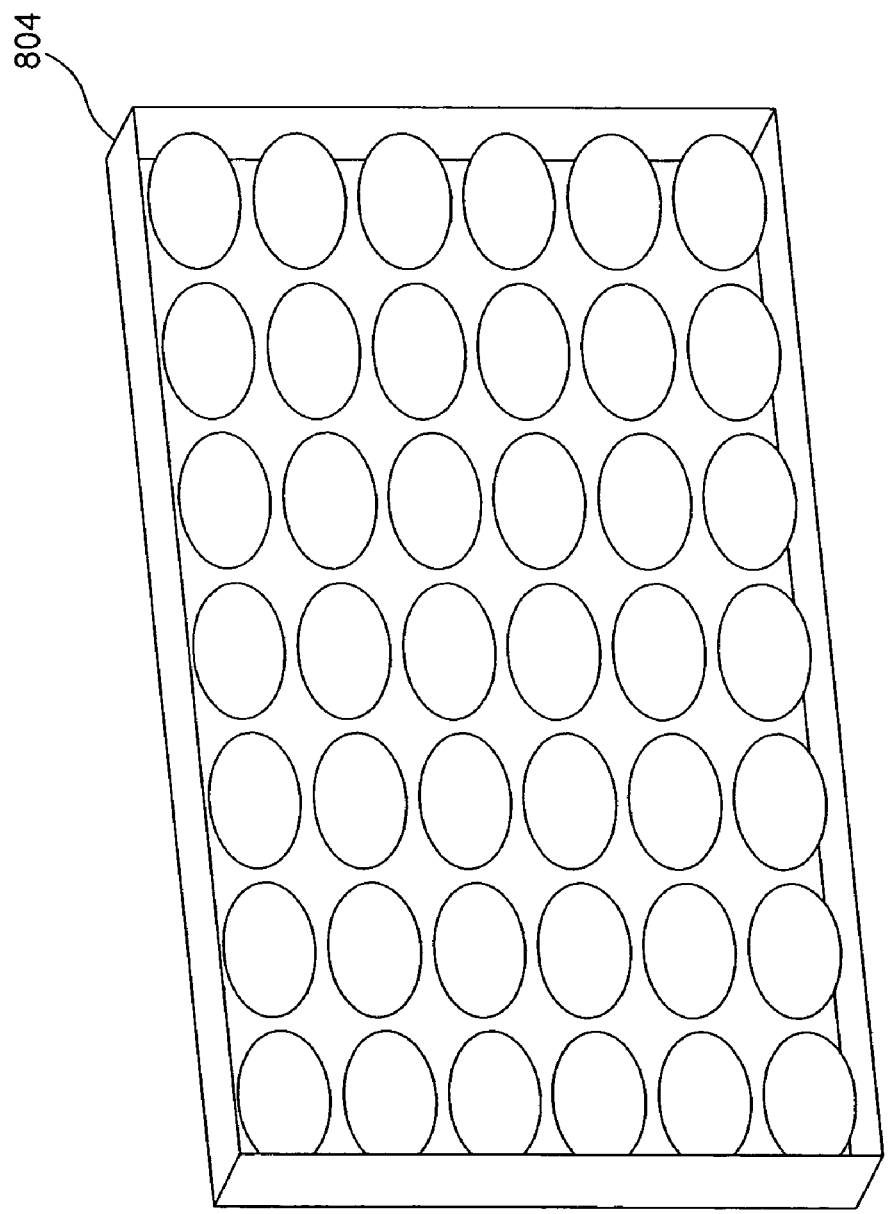
Figure 9:
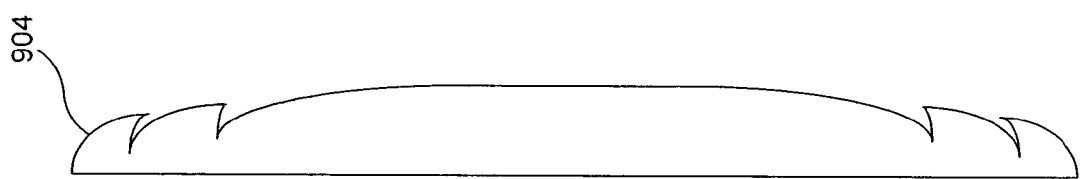

FIGS. 7, 8, and 9 show exemplary angular distribution changing elements, according to various embodiments of the present invention.

Figure 10:
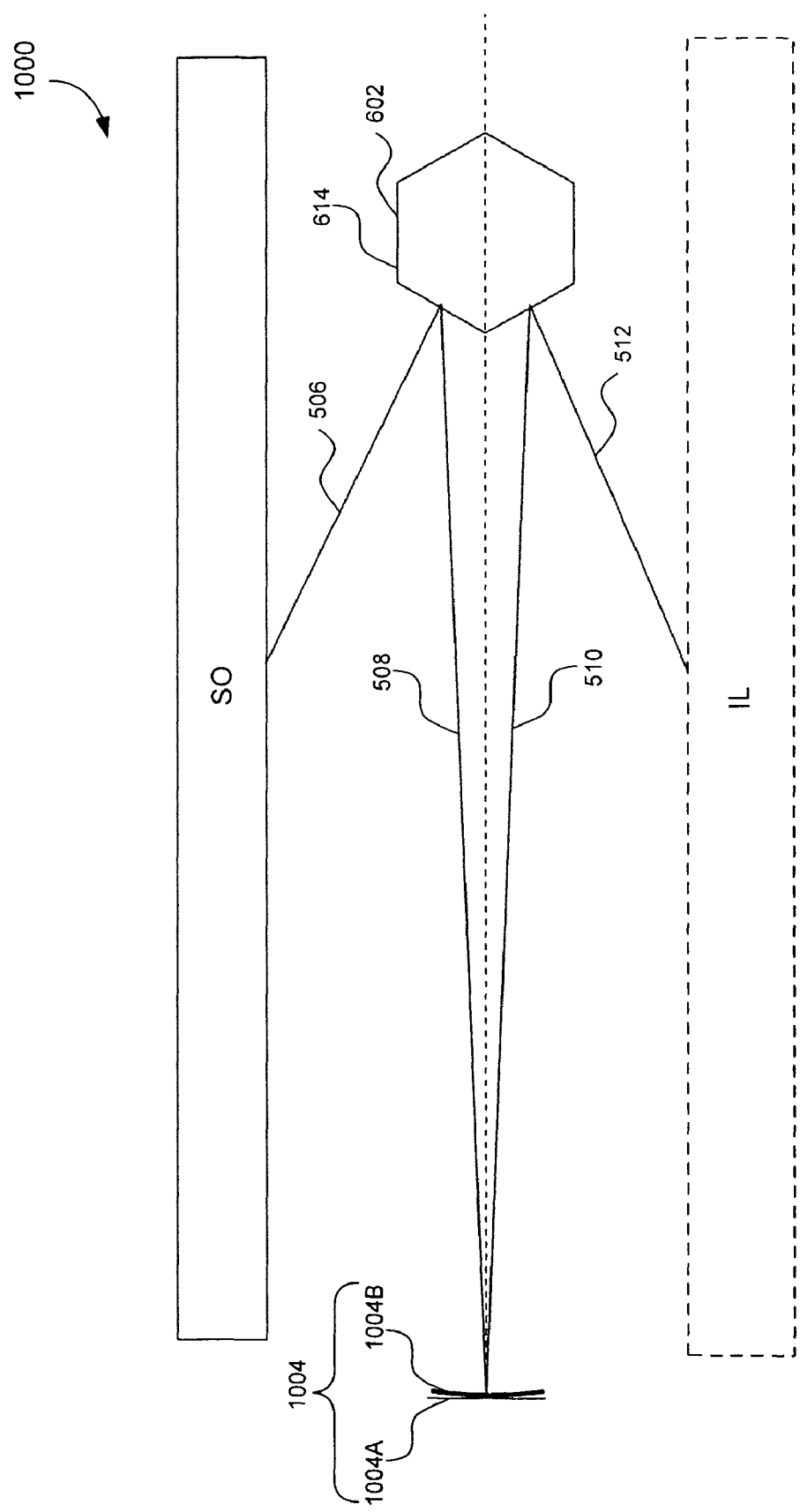
Figure 11:
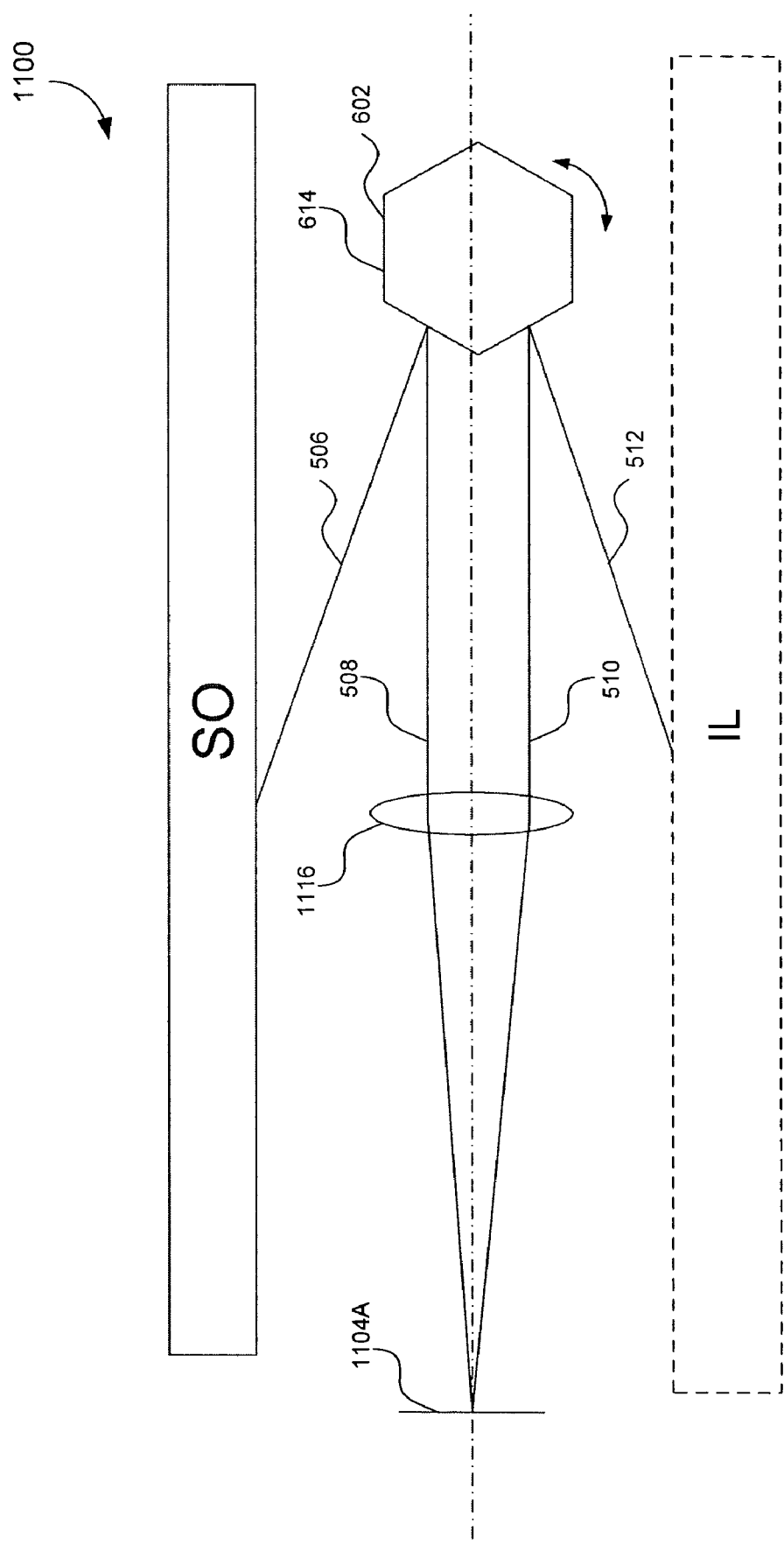
Figure 12:
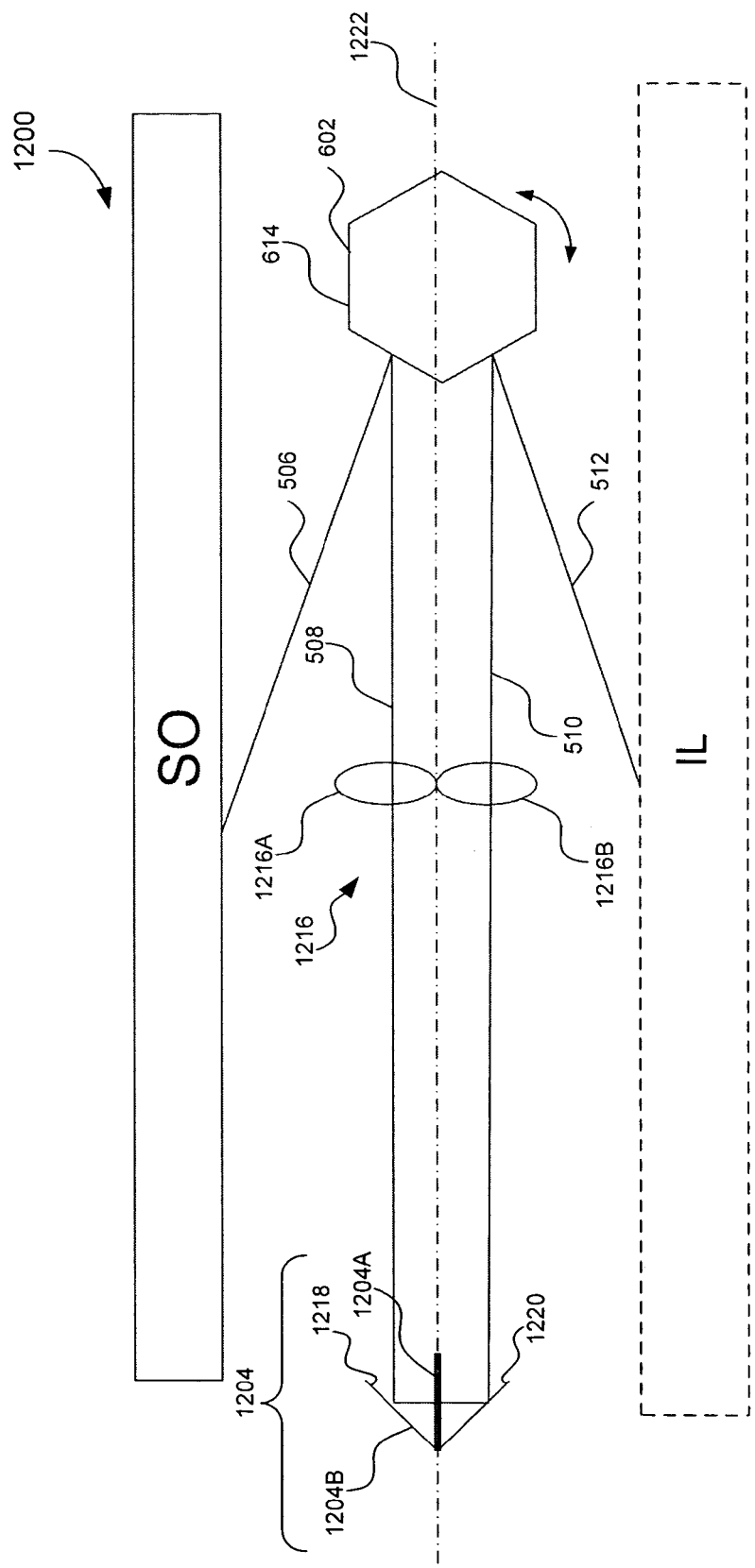

FIGS. 10, 11, and 12 show various radiation systems, according to various embodiments of the present invention.

Figure 13:
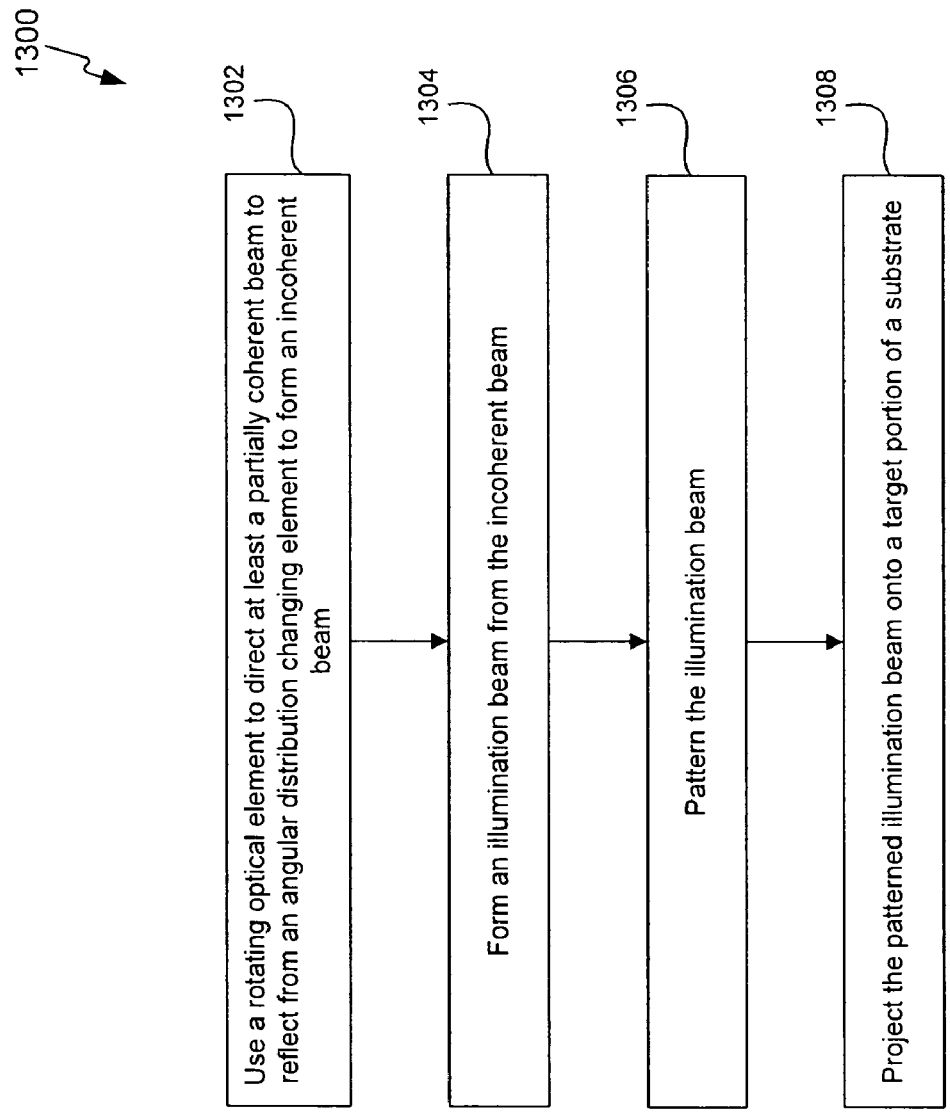

FIG. 13 shows a flowchart depicting a method, according to one embodiment of the present invention.

Figure 14:
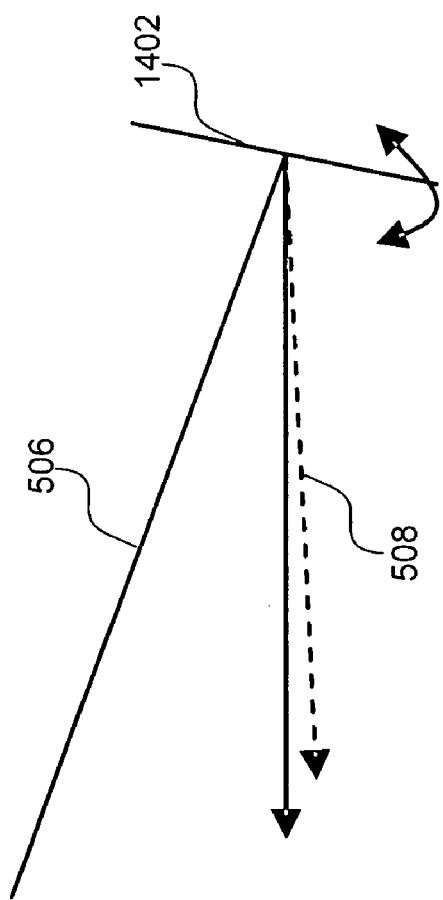
Figure 15:
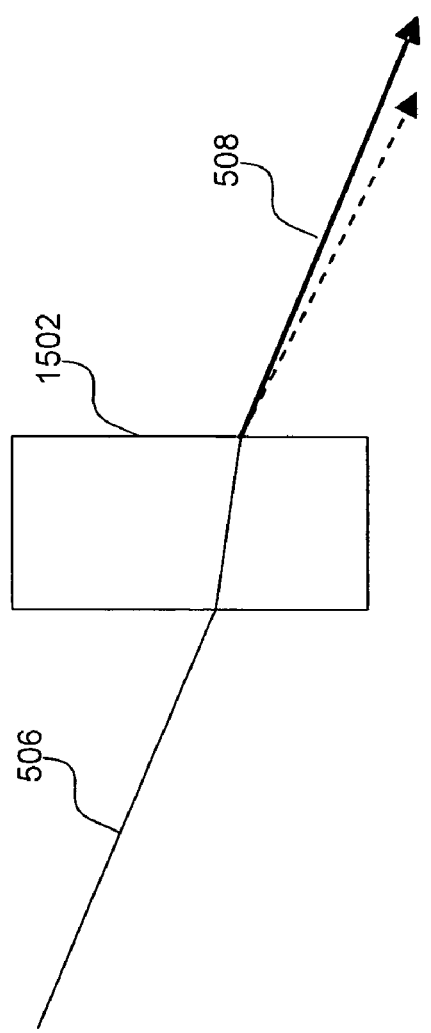

FIGS. 14 and 15 show various rotating optical elements, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

In one or more embodiments, a system and method are used to form incoherent beams from a coherent beam, such that speckle patterns are substantially eliminated. A rotating optical element directs the coherent beam to reflect from an angular distribution changing element to form an incoherent beam. The coherent beam can be directed at varying angles onto the angular distribution changing element through rotation of the rotating optical element. The angles can vary as a function of time.

Throughout the specification, the processing of coherent laser beams is equally applicable to processing of partial coherent beams, such as beams that contain multiple modes (e.g., transverse and temporal). Thus, the scope of the various embodiments of the present invention are contemplated to cover various types of beams.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
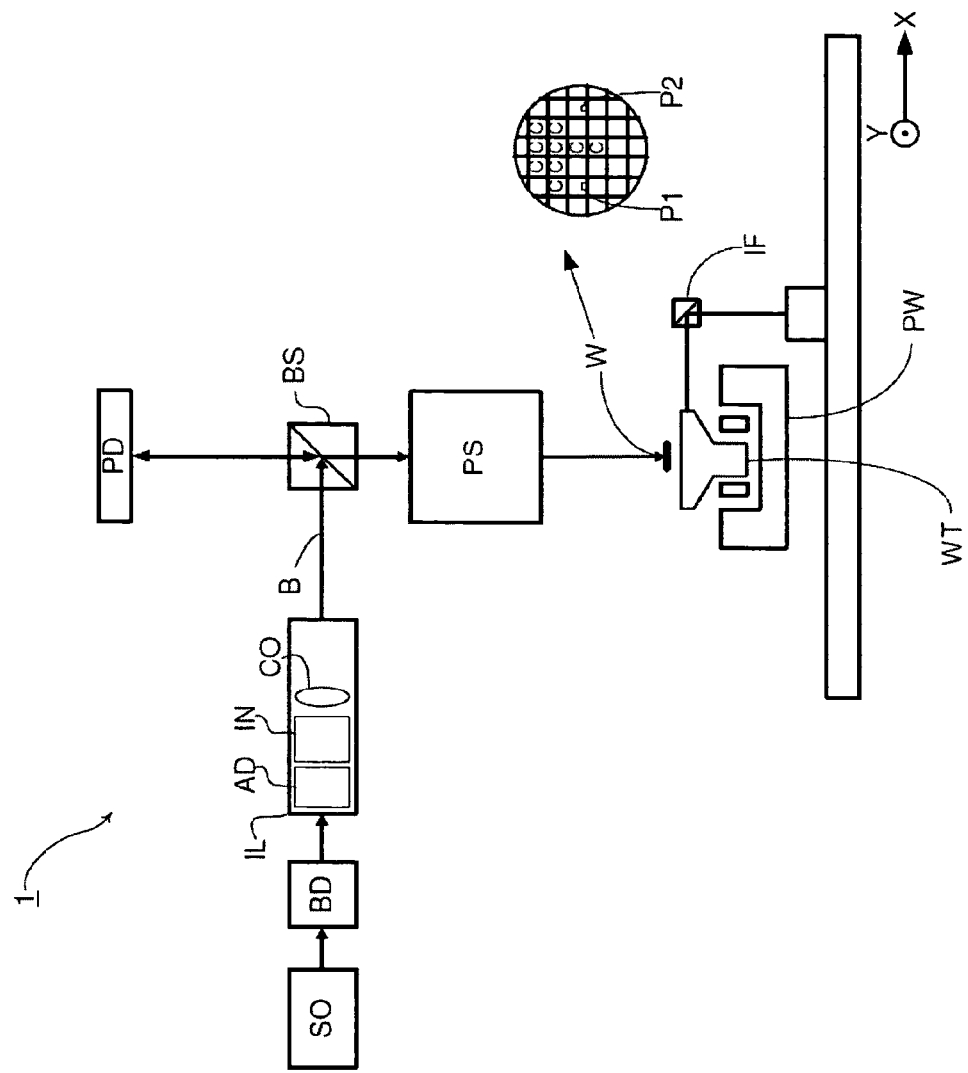
FIGS. 1 and 2 depict lithographic apparatus, according to various embodiments of the present invention.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. The thickness of the substrate may be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
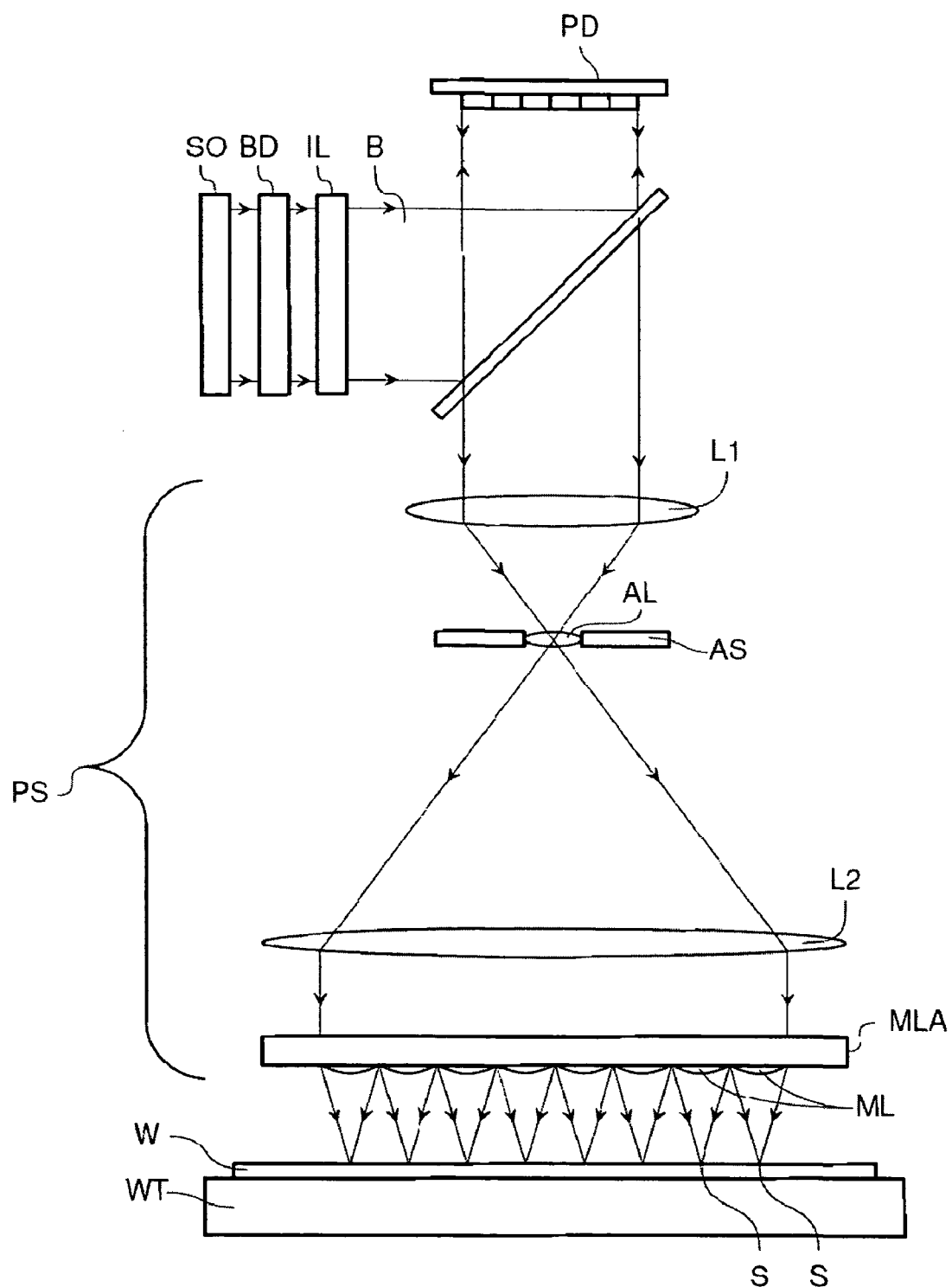

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be movable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses MLA are shown, the array of lenses can comprise many thousands of lenses (the same is true of the array of individually controllable elements used as the patterning device PD).

Figure 3:
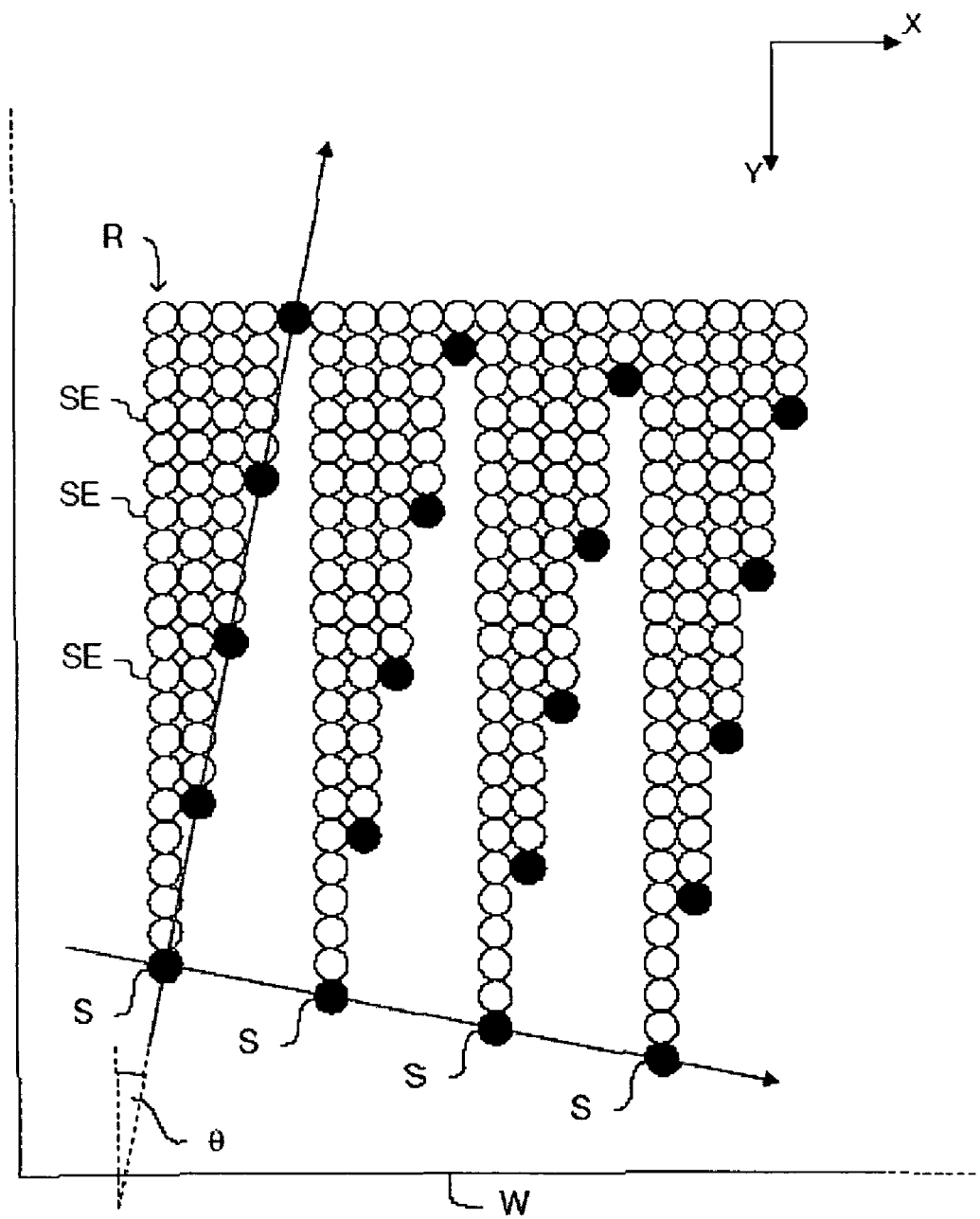
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
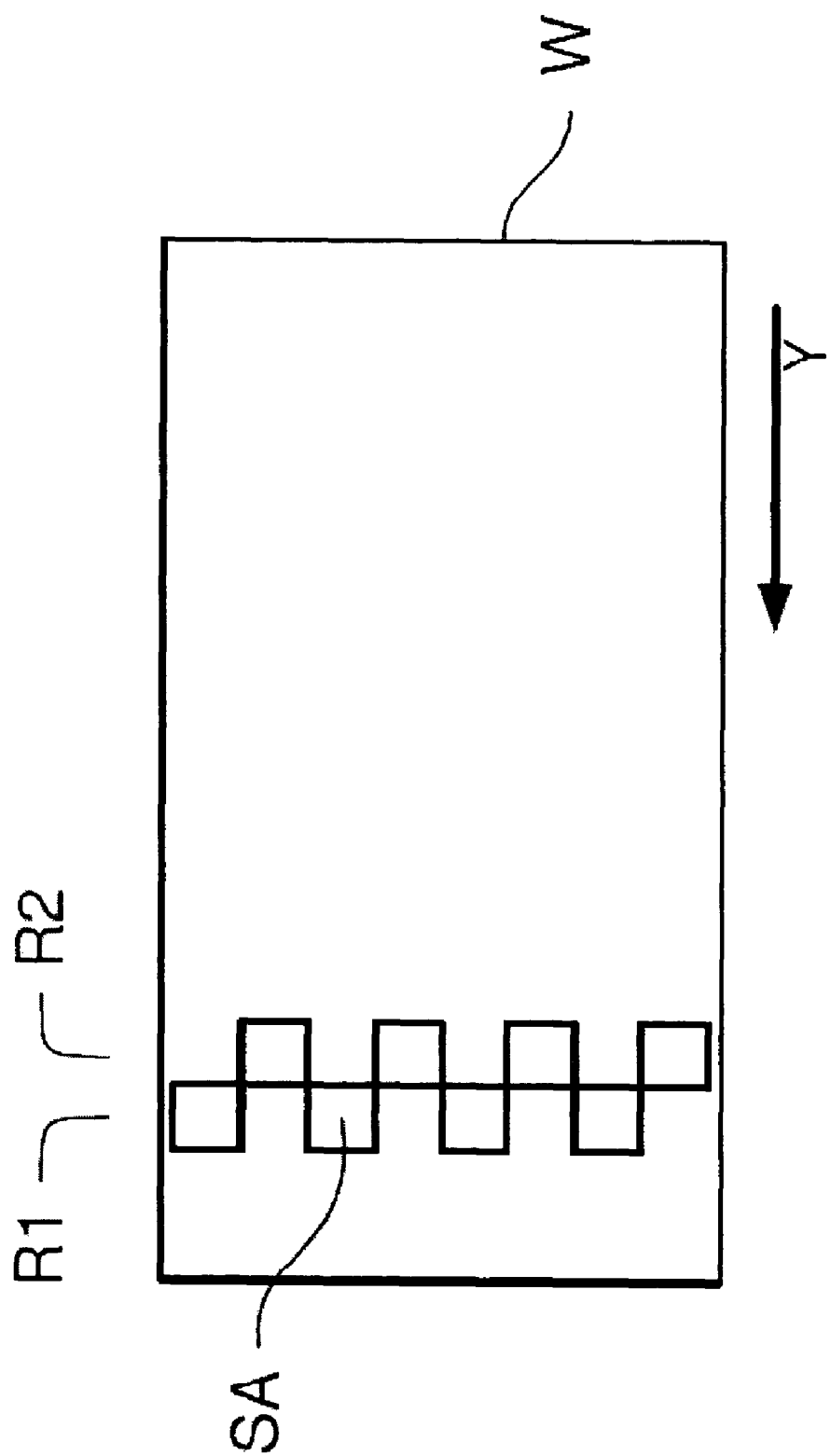
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exemplary Radiation Systems

Figure 5:
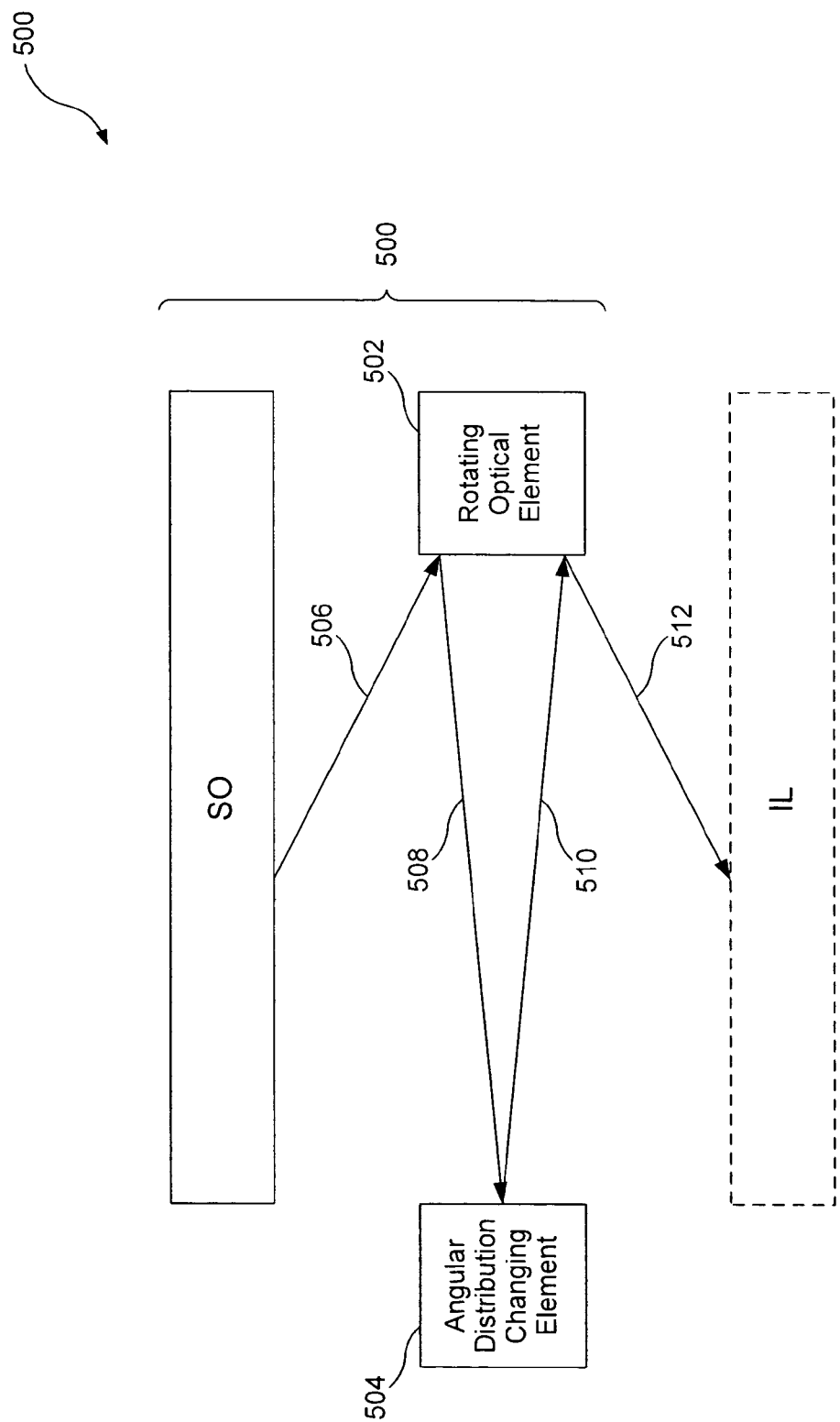
FIG. 5 shows a radiation system, according to one embodiment of the present invention.

FIG. 5 shows a radiation system 500, according to one embodiment of the present invention. Radiation system 500 includes a radiation source SO, a rotating optical element 502, and an angular distribution changing element In the example shown, radiation system 500 is located separately from illuminator IL. For example, radiation system 500 can be used in place of radiation source SO (e.g., function as a laser, or the like) and/or radiation system 500 can be used in place of both radiation source SO and beam delivery system BD in FIGS. 1 and 2, before illuminator IL. Because radiation source SO is separate from illuminator IL in only some embodiments, the illuminator IL is shown as optional through the use of dashed lines throughout FIGS. 5 and 10-12. In examples where there is no separate illuminator, radiation system 500 can be located within illuminator IL such that radiation source SO is part of illuminator IL, as discussed above with respect to FIGS. 1 and 2. In this latter case, in one example light exiting radiation system 500 may be directed onto an optical system (not shown, see FIGS. 1 and 2) or onto a patterning device (not shown, see FIGS. 1 and 2). All arrangements are contemplated within the scope of the present invention.

Alternatively, or additionally, radiation system 500 can be used for other illumination systems of a lithography apparatus, i.e., other than an exposure illumination system, such as an alignment illumination system, without departing from the scope of the present invention. Additionally, or alternatively, radiation system 500 can be used for any illumination system that requires forming of incoherent light beams and/or more uniform light beams to substantially eliminate interference or speckle patterns.

It is to be appreciated that "rotating" aspect of rotating optical element 502 and "rotation speed" of rotating optical element 502 can be in reference to the physical operation of the device, e.g., the device rotates, or can reference the inherent operation of the device, e.g., the device rotates light interacting with the device, while the device either remains stationary or moves in a non-rotating manner. All variations of rotating optical elements are contemplated within the scope of the present invention, where several are described below. It is also to be appreciated that the description of different rotating optical elements below is meant to be exemplary and not exhaustive.

The description that follows is for one embodiment, in which radiation system 500 is located before illumination system IL. In one example, radiation source SO is a laser that produces a coherent beam 506. Coherent beam 506 is reflected from rotating optical element 502 to form a second coherent beam 508. Coherent beam 508 is reflected from angular distribution changing element 504 to form an incoherent beam 510. Incoherent beam 510 is reflected from rotating optical element 502 to form a second incoherent beam 512. Incoherent beam 512 is received by illuminator IL. As discussed above, throughout this description although the description is in terms of the use of a coherent beam, partial coherent beams are also contemplated within the scope of the present invention.

Through this configuration, rotating optical element 502 moves or scans coherent beam 508 with respect to angular distribution changing element 504 through various angles of reflection of coherent beam 508. The angles of reflection of coherent beam 508 are varied as a function of time based on a rotation speed of rotating optical element 502 and/or a frequency of coherent beam 506. During varying of the angles of reflection, an increased angular distribution of incoherent beam 510 remains constant, but a phase distribution over the angles changes. This phase distribution change in incoherent beam 510 (and 512) causes interference or speckle patterns to be substantially eliminated when incoherent beam 512 is used by illuminator IL to form an illumination beam (e.g., beam B in FIG. 1).

Additionally, or alternatively, a distance between rotating optical element 502 and angular distribution changing element 504 can affect a size of a range of angles of reflection. In one example, rotating optical element 502 is placed a distance of about 3 m from angular distribution changing element 504 to allow for a significant range of the angles of reflection of coherent beam 508.

It is to be appreciated other optical elements (e.g., lenses, mirrors, etc.) may need to be added to the radiation system 500 in order to properly process and direct light between source SO, rotating optical element 502, angular distribution changing element 504, and illuminator IL, as would be understood by a skilled artisan. Exemplary optical element configurations are discussed with reference to FIGS. 10, 11, and 12 below.

Figure 6:
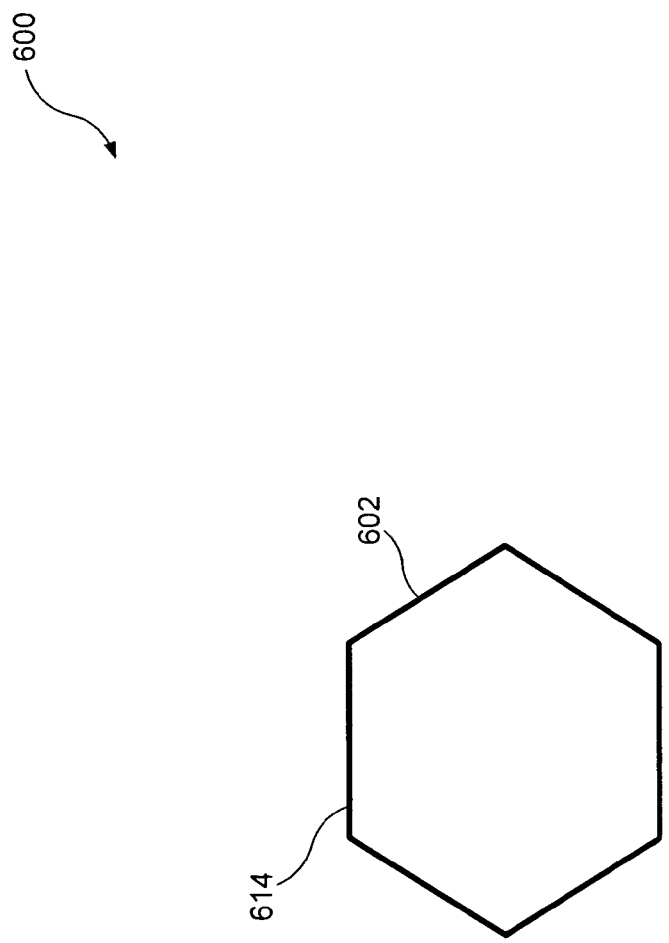
FIG. 6 shows a rotating optical element, according to one embodiment of the present invention.

FIGS. 6, 14, and 15 show various rotating optical elements 602, 1402, and 1502, respectively, according to various embodiments of the present invention. In the embodiment shown in FIG. 6, rotating optical element 602 comprises a rotating polygonal mirror having six reflecting surfaces 614 (e.g., facets). Alternatively, other shapes of rotating mirrors could also be used. In the embodiment shown in FIG. 14, a piezoelectric table 1402 can be used in order to move (scan) coherent beam 508 with respect to angular distribution changing device 504 (not shown). In the embodiment shown in FIG. 15, an opto-electric device 1502 (e.g., an opto-electric modulator) can be used in transmission mode to deflect coherent beam 506 through switching ON and OFF an electrical power field across opto-electric device 1502 to produce coherent beam 508. As a result of the switching, a gradient in an index of refraction within opto-electric device 1502 changes, such that beam 506 deflects. Opto-electric device 1502 can be, but is not limited to, crystals such as KDP, crystalline quartz, etc.

With reference again to FIG. 5, and continued reference to FIG. 6, system 500 is configured to utilize a "double reflection" scheme, such that a stable incoherent beam 512 is produced. In a double reflection scheme, a beam is reflected twice from rotating optical element 502/602. For example, a first reflection occurs when coherent beam 506 reflects from rotating optical element 502/602 to form coherent beam 508, and a second reflection occurs when incoherent beam 510 reflects from rotating optical element 502/602 to form incoherent beam 512. This can allow for a possibly unstable coherent beam 508, resulting from the first reflection, to become a stable incoherent beam 512 after the second reflection. Also, if there were only one reflection from rotating polygonal mirror 602, a very tight synchronization tolerance would be required between a positioning of reflecting surfaces 614 of rotating polygonal mirror 602, a speed of rotation of rotating polygonal mirror 602, and a frequency of radiation source SO, e.g., laser pulsing of radiation source SO. For example, the relationship between radiation source SO and rotating polygonal mirror 602 can be characterized as:

Number of Facets (reflecting surfaces) of Rotating Optical Element×Cycles Per Second of Rotating Optical Element=Laser Pulse Rate If a 6 kHz laser radiation source SO is used and rotating polygonal mirror 602 includes six reflecting surfaces (facets) 614, a 1 kHz rotation speed of rotating polygonal mirror 602 would be required. In another example, characteristics of system 500 can be expressed as follows:

$$v = \frac{\Delta x}{\Delta t},$$
$$v = \frac{\alpha}{F},$$
$$\omega = \alpha = \frac{\upsilon}{N},$$
$$\Rightarrow$$
$$\Delta x = \frac{\Delta t \cdot \upsilon}{F \cdot N}$$

where:
ω equals the rotation speed [Hz=s⁻¹]
N equals the number of facets of the rotating polygonal mirror [−]
α equals the change of the rotation angle [rad/s=Hz]
υ equals the laser repetition rate [Hz=s⁻¹]
F equals focal length of the lens between the rotating polygonal mirror and the angular distribution changing element [m⁻¹], such that 1/F is used for calculation
v equals the speed with which the beam moves with respect to the angular distribution changing element [m/s]
Δt equals the integration time/pulse length [s]
Δx equals the integration length/pulse movement [m]

Thus, in an example where integration time is 50 ns, laser repetition rate is 6 kHz, focal length is 3 m, and there are six facets on rotating polygonal mirror 602, an integration length per pulse movement is:

$$\Delta x = 2 * 50 \text{ ns} * 6 \text{ kHz}/(3 \text{ m}^{-1}) = 1.8 \text{ mm}$$

Any variation in a pulse rate of radiation source SO and/or rotational speed of rotating polygonal mirror 602 can cause an angle of reflection of coherent beam 506 from reflecting surface 614 to vary slightly during each pulse, which can cause instability in coherent beam 508. However, through use of the double reflection scheme a reflection angle error is the same, but opposite, for the first and second reflections. Thus, the second reflection compensates for any error introduced by the first reflection, so that after the second reflection incoherent beam 512 is stable. Additionally, or alternatively, with the double reflection scheme, although synchronization remains important, synchronization is no longer critical.

FIGS. 7, 8, and 9 show exemplary angular distribution changing elements 704, 804, and 904, respectively, according to various embodiments of the present invention. For example, elements 704, 804, and 904 can be used to increase the angular distribution of coherent beam 508.

The exemplary angular distribution changing element 704 in FIG. 7 comprises a diffractive element, such as a diffraction grating, or the like. Additionally, or alternatively, a diffuser, e.g., wet etched or holographic, could also be used instead of a diffractive grating. The exemplary element 804 shown in FIG. 8 comprises a refractive optical element 804, such as an array of lenses, or the like. The exemplary element 904 shown in FIG. 9 comprises a zone lens or a Fresnel zone lens 904. Additionally, or alternatively, a zone plate or Fresnel zone plate could be used instead of a zone lens or Fresnel zone lens.

FIGS. 10, 11, and 12 show exemplary radiation systems 1000, 1100, and 1200, respectively, according to various embodiments of the present invention.

In the embodiment shown in FIG. 10, system 1000 includes radiation source SO, rotating polygon mirror 602, an angular distribution changing element 1004, and illuminator IL. Angular distribution changing element 1004 includes a reflecting device 1004A and a lens 1004B. Reflecting device 1004A includes a micro structure (not shown) that is used to change the angular distribution of coherent beam 508. Alternatively, or additionally, the micro structure of reflecting device 1004A can be configured as one or more of the angular distribution changing elements discussed above with respect to FIGS. 7, 8, and/or 9. In operation, coherent beam 508 is directed by lens 1004B to reflect from reflecting device 1004A to form incoherent beam 510. Incoherent beam 510 is directed by lens 1004B back onto rotating polygon mirror 602.

In the embodiment shown in FIG. 11, system 1100 includes radiation source SO, rotating polygon mirror 602, an angular distribution changing element 1104, and illuminator IL. This embodiment is similar to the one shown in FIG. 10, except lens 1004B has been removed from angular distribution changing element 1104, which instead includes a reflecting device 1104A having a micro structure (not shown), and a lens 1116 has been positioned between rotating polygon mirror 602 and reflecting device 1104A. Alternatively, or additionally, the micro structure of reflecting device 1104A can be configured as one or more of the angular distribution changing elements discussed above with respect to FIGS. 7, 8, and/or 9. In operation, lens 1116 focuses coherent beam 508 onto reflecting device 1104A to form incoherent beam 510. Incoherent beam 510 is directed by lens 1116 onto rotating polygonal mirror 602.

In the embodiment shown in FIG. 12, system 1200 includes radiation source SO, rotating polygonal mirror 602, an angular distribution changing element 1204, a lens system 1216, which includes a first lens 1216A and a second lens 1216B, and illuminator IL. In this embodiment, angular distribution changing element 1204 includes a transmissive element 1204A and a reflective element 1204B. Reflective element 1204B can be a corner reflector that is symmetrical about an axis 1222. Transmissive element 1204A can extend longitudinally along axis 1222 and include a micro structure (not shown). The micro structure changes the angular distribution of coherent beam 508 as it is transmitted through transmissive element 1204A to form incoherent beam 510. Alternatively, or additionally, the micro structure of the transmissive device 1204A can be configured as one or more of the angular distribution changing elements discussed above with respect to FIGS. 7, 8, and/or 9. In operation, coherent beam 508 is directed by lens 1216A to reflect from a first interior surface 1218 of reflective element 1204B. After reflecting, coherent beam 508 transmits through transmissive element 1204A to form incoherent beam 510. Incoherent beam 510 is then reflected from second interior surface 1220 of reflective element 1204B before being directed by lens 1216B onto rotating polygonal mirror 602.

It is to be appreciated that other elements and configurations of elements can be used for angular distribution changing element 504, such that the above described embodiments and/or examples are merely exemplary and not exhaustive.

Alternatively, or additionally, one or more reflecting surfaces 614 of rotating polygonal mirror 602 can have optical power, which may allow for the removing of one or more lenses or mirrors needed to direct or process light in system 500. Also, alternatively or additionally, one or more of the angular distribution changing elements 504, 704, 804, 904, 1004, 1104, and/or 1204 can have optical power, which may allow for the removing of one or more lenses or mirrors needed to direct or process light in system 500.

FIG. 13 shows a flowchart depicting a method 1300, according to one embodiment of the present invention. In step 1302, at least a partially coherent beam is directed, using a rotating optical element, to reflect from an angular distribution changing element to form an incoherent beam. In step 1304, an illumination beam is formed from the incoherent beam. In step 1306, the illumination beam is patterned. In step 1308, the patterned illumination beam is projected onto a target portion of a substrate.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system, comprising:
   a source of radiation configured to produce at least a substantially coherent beam;
   a stationary angular distribution changing element; and
   a rotating optical element that is configured to (a) receive the substantially coherent beam from the source of radiation and (b) direct the received substantially coherent beam to reflect from the angular distribution changing element to form an incoherent beam,
   wherein the substantially coherent beam is directed at varying angles or positions onto the angular distribution changing element based on a rotation speed of the rotating optical element, the angles varying as a function of time.

2. The system of claim 1, wherein the angular distribution changing element comprises a diffuser or a diffuser and a reflecting device.

3. The system of claim 2, wherein the diffuser comprises a wet etched or holographic diffuser.

4. The system of claim 1, wherein the angular distribution changing element comprises a diffractive optical element or a diffractive optical element and a reflecting device.

5. The system of claim 1, wherein the angular distribution changing element comprises a refractive optical element, a refractive optical element and lens, or a refractive optical element and a reflecting device.

6. The system of claim 1, wherein the angular distribution changing element comprises a zone lens, a Fresnel zone lens, a zone plate, or a Fresnel zone plate or a reflecting device and a zone lens, a Fresnel zone lens, a zone plate, or a Fresnel zone plate.

7. The system of claim 1, wherein the rotating optical element comprises a rotating mirror.

8. The system of claim 7, wherein the rotating mirror comprises a rotating polygonal minor.

9. The system of claim 1, wherein the rotating optical element comprises a piezoelectric table.

10. The system of claim 1, wherein the rotating optical element comprises an opto-electric modulator.

11. The system of claim 1, wherein the angular distribution changing element is configured to increase angular distribution of the beam of radiation.

12. The system of claim 1, wherein the angular distribution changing element includes a reflecting surface having an optical power.

13. The system of claim 1, wherein the rotating optical element includes reflecting surfaces having optical power.

14. The system of claim 1, further comprising:
    an illuminator, wherein the rotating optical element is configured to direct the incoherent beam onto the illuminator.

15. The system of claim 1, wherein the rotating optical element is configured to reflect the incoherent beam from the angular distribution changing element onto an illuminator, an optical system, or a patterning device.

16. A laser that outputs an incoherent output beam, comprising:
    a source of radiation configured to produce at least a substantially coherent beam;
    a stationary angular distribution changing element; and
    a rotating optical element that is configured to (a) receive the substantially coherent beam from the source of radiation and (b) direct the received substantially coherent beam to reflect from the angular distribution changing element to form the incoherent output beam,
    wherein the substantially coherent beam is directed at varying angles or positions onto the angular distribution changing element based on a rotation speed of the rotating optical element, the angles varying as a function of time.

17. The laser of claim 16, wherein the rotating optical element is further configured to receive the incoherent beam from the angular distribution changing element.

18. The laser of claim 16, wherein the angular distribution changing element comprises a diffuser, a wet etched diffuser, a holographic diffuser, a diffractive optical element, a refractive optical element, a zone lens, a Fresnel zone lens, a zone plate, or a Fresnel zone plate.

19. The laser of claim 18, wherein the angular distribution changing element further comprises a lens or a reflecting device.

20. The laser of claim 16, wherein the rotating optical element comprises a rotating mirror, a rotating polygonal mirror, a piezoelectric table, or an opto-electric device.

21. The laser of claim 16, wherein at least one of the angular distribution changing element or the rotating optical element includes a reflecting surface having optical power.

22. An illuminator that outputs an incoherent illumination beam, comprising:
    a source of radiation configured to produce at least a substantially coherent beam;
    a stationary angular distribution changing element; and
    a rotating optical element that is configured to (a) receive the substantially coherent beam from the source of radiation and (b) direct the received substantially coherent beam to reflect from the angular distribution changing element to form the incoherent illumination beam,
    wherein the substantially coherent beam is directed at varying angles or positions onto the angular distribution changing element based on a rotation speed of the rotating optical element, the angles varying as a function of time.

23. The illuminator of claim 22, wherein the rotating optical element is further configured to receive the incoherent beam from the angular distribution changing element.

24. The illuminator of claim 22, wherein the angular distribution changing element comprises a diffuser, a wet etched diffuser, a holographic diffuser, a diffractive optical element, a refractive optical element, a zone lens, a Fresnel zone lens, a zone plate, or a Fresnel zone plate.

25. The illuminator of claim 24, wherein the angular distribution changing element further comprises a lens or a reflecting device.

26. The illuminator of claim 22, wherein the rotating optical element comprises a rotating mirror, a rotating polygonal mirror, a piezoelectric table, or an opto-electric device.

27. The illuminator of claim 22, wherein at least one of the angular distribution changing element or the rotating optical element includes a reflecting surface having optical power.

28. A system, comprising:
a source of radiation configured to produce at least a substantially coherent beam;
an angular distribution changing element; and
a rotating optical element that is configured to,
receive the substantially coherent beam from the source of radiation,
direct the received substantially coherent beam to reflect from the angular distribution changing element to from in an incoherent beam, wherein the substantially coherent beam is directed at varying angles or positions onto the angular distribution changing element based on a rotation speed of the rotating optical element, the angles varying as a function of time,
receive the incoherent beam from the angular distribution changing element, and
direct the incoherent beam for formation of an illumination beam.

29. The system of claim 28, wherein:
the substantially coherent beam received from the source of radiation is directed from a first facet in a first plane of the rotating optical element; and
the incoherent beam from the angular distribution changing element is reflected from a second facet in a second plane of the rotating optical element.

30. A system, comprising:
a source of radiation configured to produce at least a substantially coherent beam;
a stationary angular distribution changing element; and
a rotating optical element that is configured to (a) receive the substantially coherent beam from the source of radiation and (b) direct the received substantially coherent beam to reflect from the angular distribution changing element to form an incoherent beam,
wherein the substantially coherent beam is directed at varying angles or positions onto the angular distribution changing element based on a rotation speed of the rotating optical element, the angles varying as a function of time, and
wherein the incoherent beam comprises a plurality of sub-copies of the substantially coherent beam generated by the stationary angular distribution changing element.

* * * * *

UNITED STATES PATENT AND TRADEMARK OFFICE
CERTIFICATE OF CORRECTION

PATENT NO. : 7,948,606 B2  Page 1 of 1
APPLICATION NO. : 11/403194
DATED : May 24, 2011
INVENTOR(S) : Visser et al.

It is certified that error appears in the above-identified patent and that said Letters Patent is hereby corrected as shown below:

In claim 28, line 21, column 19, please delete --from in-- and insert "form".

Signed and Sealed this
Twelfth Day of July, 2011

David J. Kappos
*Director of the United States Patent and Trademark Office*